United States Patent
Wang et al.

(10) Patent No.: US 11,859,965 B2
(45) Date of Patent: Jan. 2, 2024

(54) MATERIAL ANALYSIS METHOD

(71) Applicant: GlobalWafers Co., Ltd., Hsinchu (TW)

(72) Inventors: Shang-Chi Wang, Hsinchu (TW);
Wen-Ching Hsu, Hsinchu (TW);
Chia-Chi Tsai, Hsinchu (TW); I-Ching Li, Hsinchu (TW)

(73) Assignee: GlobalWafers Co., Ltd., Hsinchu (TW)

( * ) Notice: Subject to any disclaimer, the term of this patent is extended or adjusted under 35 U.S.C. 154(b) by 127 days.

(21) Appl. No.: 17/736,107

(22) Filed: May 4, 2022

(65) Prior Publication Data
US 2022/0357152 A1   Nov. 10, 2022

(30) Foreign Application Priority Data
May 4, 2021   (TW) .................. 110116086

(51) Int. Cl.
*G01N 23/00* (2006.01)
*G01B 15/04* (2006.01)
*G01N 23/20* (2018.01)

(52) U.S. Cl.
CPC ............. *G01B 15/04* (2013.01); *G01N 23/20* (2013.01); *G01N 2223/056* (2013.01)

(58) Field of Classification Search
None
See application file for complete search history.

(56) References Cited

U.S. PATENT DOCUMENTS

| | | | |
|---|---|---|---|
| RE46,315 E | | 2/2017 | Zwieback et al. |
| 2021/0115592 A1* | | 4/2021 | Park ...................... C01B 32/956 |
| 2021/0123160 A1* | | 4/2021 | Park ........................ B28D 5/00 |
| 2022/0234250 A1* | | 7/2022 | Pietsch .............. B23D 57/0053 |

FOREIGN PATENT DOCUMENTS

| | | |
|---|---|---|
| CN | 105556649 | 3/2018 |
| TW | 200425370 | 11/2004 |
| TW | 200811913 | 3/2008 |
| WO | 2020068139 | 4/2020 |
| WO | 2020154708 | 7/2020 |

* cited by examiner

Primary Examiner — Hoon K Song
(74) Attorney, Agent, or Firm — JCIPRNET

(57) ABSTRACT

A material analysis method is provided. A plurality of wafers processed from a plurality of ingots are measured by a measuring instrument to obtain an average of a bow of each of the wafers processed from the ingots and a plurality of full widths at half maximum (FWHM) of each of the wafers. Key factors respectively corresponding to the ingots are calculated according to the FWHM of the wafers. A regression equation is obtained according to the key factors and the average of the bows.

8 Claims, 2 Drawing Sheets

S205 — Measuring, by a measuring instrument, a plurality of wafers processed from a plurality of ingots S210 — Calculating each key factor corresponding to one of the ingots according to each FWHM of one of the wafers S215 — Obtaining a regression equation based on an average of bows of the processed wafers and the key factors

MATERIAL ANALYSIS METHOD

CROSS-REFERENCE TO RELATED APPLICATION

This application claims the priority benefit of Taiwan application serial no. 110116086, filed on May 4, 2021. The entirety of the above-mentioned patent application is hereby incorporated by reference herein and made a part of this specification.

BACKGROUND

Technical Field

The disclosure relates to an evaluation and inspection method; more particularly, the disclosure relates to a material analysis method which may be applied to predict a bow of a wafer after the wafer is processed from an ingot.

Description of Related Art

Ingot verification has always been a crucial issue; in particularly, ingot stress poses a significant impact on subsequent processing steps. Here, the bow of the wafer is directly associated with quality of the wafer.

At present, if a manufacturer intends to learn the bow of the wafer, the manufacturer may measure the bow of the wafer after an ingot is purchased and processed. If the quality of the resultant wafer does not meet the requirements, the ingot is wasted. In light of the above, how to evaluate the quality of the ingot and estimate the bow of the resultant wafer in advance so as to predict the quality of the processed wafer before the ingot is processed and prevent unnecessary waste is one of the topics to be addressed nowadays.

SUMMARY

The disclosure provides a material analysis method which may be applied to predict a bow of a wafer processed from an ingot.

In an embodiment of the disclosure, a material analysis method is provided, and the method includes following steps. A plurality of wafers processed from a plurality of ingots are measured by a measuring instrument to obtain an average of bows of the processed wafers and a plurality of full widths at half maximum (FWHM) of the wafers. Each key factor corresponding to one of the ingots is calculated according to each of the FWHM of one of the wafers. A regression equation is obtained according to the average of the bows and the key factors corresponding to the ingots.

In an embodiment of the disclosure, the step of measuring, by the measuring instrument, the wafers processed from the ingots includes: measuring the bows of the wafers from a same ingot of each of the ingots, respectively, calculating the average of the bows based on the bows, and measuring the FWHM of each of a plurality of designated positions on a first wafer and a second wafer of the wafers processed from the same ingot of each of the ingots.

In an embodiment of the disclosure, the first wafer and the second wafer are wafers respectively located at a head end and a tail end of the same ingot.

In an embodiment of the disclosure, the step of calculating each of the key factors corresponding to one of the ingots according to each of the FWHM of one of the wafers includes following steps. A first coefficient of variation of the first wafer and a second coefficient of variation of the second wafer are calculated according to the FWHM of each of the first wafer and the second wafer processed from the same ingot of each of the ingots. The key factor corresponding to the same ingot is calculated according to the first coefficient of variation and the second coefficient of variation.

In an embodiment of the disclosure, the step of calculating the key factor based on the first coefficient of variation and the second coefficient of variation includes: calculating a difference between the first coefficient of variation and the second coefficient of variation and obtaining an absolute value of the difference as the key factor.

In an embodiment of the disclosure, the designated positions include a center position on each of the first wafer and the second wafer and four representation positions on each of four quadrants.

In an embodiment of the disclosure, the center position on each of the first wafer and the second wafer is set as an origin, and each of the first wafer and the second wafer is divided into four quadrants.

In an embodiment of the disclosure, after the regression equation is obtained, the method further includes: measuring an FWHM of a to-be-measured ingot corresponding to a to-be-measured ingot, accordingly calculating the key factor, and inputting the key factor to the regression equation to obtain a predicted bow of a wafer processed from the to-be-measured ingot.

In view of the above, according to one or more embodiments of the disclosure, the regression equation may be applied to obtain a predicted bow of a wafer processed from an ingot before the ingot is processed to form the wafer, whereby a geometric quality of the resulting wafer processed from the ingot may be predicted, and unnecessary waste may be prevented.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Figure 1:
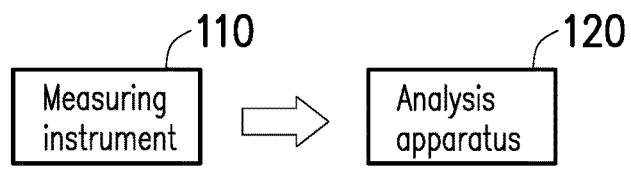
FIG. 1 is a block view of an analysis system according to an embodiment of the disclosure.

FIG. 1 is a block view of an analysis system according to an embodiment of the disclosure. With reference to FIG. 1, the analysis system includes a measuring instrument 110 and an analysis apparatus 120. Data may be transmitted between the measuring instrument 110 and the analysis apparatus 120 through a cable or through wireless communications, for instance.

The measuring instrument 110 includes a diffractometer, such as an X-ray diffractometer (XRD) or an optical instrument, e.g., FRT or Tropel, which may respectively serve to measure the wafer and obtain a full width at half maximum (FWHM) of different positions on each wafer and a bow of the wafer. The measuring instrument 110 may be implemented in form of any device for measuring the FWHM and the bow of the wafer, which should however not be construed as a limitation in the disclosure. The XRD bombards a metal target with accelerated electrons to generate an X-ray and then irradiates the X-ray to the wafer to obtain a crystal structure. When the X-ray is emitted to a lattice plane at an incident angle θ, a diffraction peak is generated when conditions satisfy Bragg's Law (nλ=2d sin θ), where n is an integer, λ is w wavelength of the incident X-ray, d is an interplanar spacing in atomic lattice, and θ is an included angle between the incident X-ray and a scattered plane. The FWHM is obtained by calculating a half width of the highest diffraction peak position. The FWHM may represent the crystal quality. Therefore, the FWHM is measured as referential data.

The analysis apparatus 120 is an electronic apparatus with an arithmetic function and may be implemented in form of a personal computer, a notebook computer, a tablet, a smart phone, or any apparatus with the arithmetic function, which should however not be construed as a limitation in the disclosure. The analysis apparatus 120 receives a plurality of measurement data of known wafers from the measuring instrument 110, so as to perform training to obtain a forecast model (a regression equation) for subsequently predicting a bow of a wafer processed from an ingot according to the measurement data of a to-be-measured wafer after the ingot is obtained and processed to form the wafer.

Figure 2:
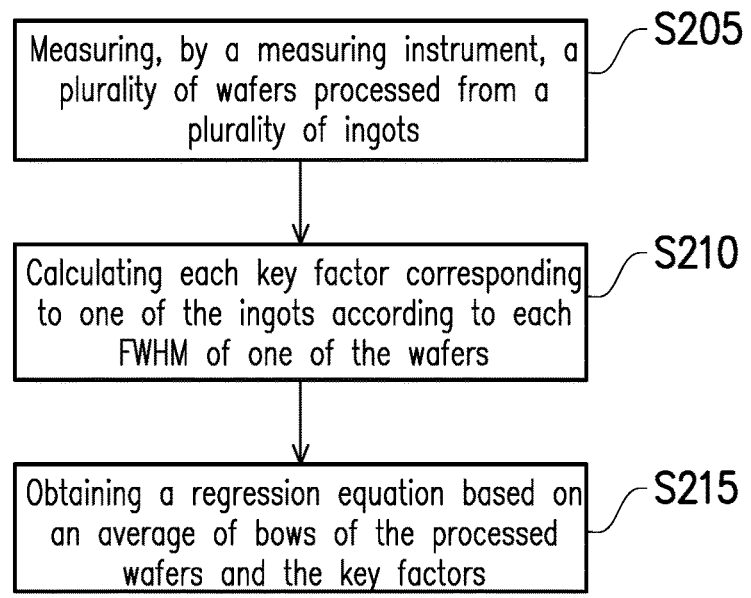
FIG. 2 is a flowchart of a material analysis method according to an embodiment of the disclosure.

FIG. 2 is a flowchart of a material analysis method according to an embodiment of the disclosure. With reference to FIG. 2, in step S205, a plurality of wafers processed from a plurality of ingots are measured by the measuring instrument 110 to obtain an average of bows of the processed wafers and a plurality of FWHM of the wafers. Here, each ingot undergoes one or a plurality of processing steps, such as slicing, lapping, polishing, and so on, so as to form wafers, and the measuring instrument 110 one by one measures the resulting wafers processed from each ingot to obtain the bow of each wafer. The analysis apparatus 120 then obtains the average of the bows of the wafers.

Figure 3:
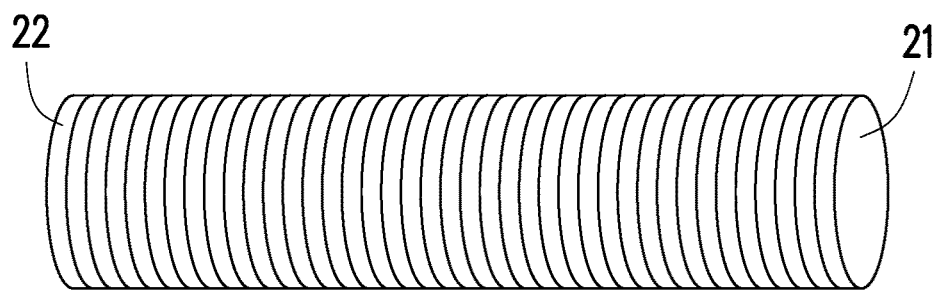
FIG. 3 is a schematic view of an ingot according to an embodiment of the disclosure.

In addition, the measuring instrument 110 respectively measures the FWHM of a plurality of designated positions on the wafers. In an embodiment, the FWHM of the designated positions on two wafers, i.e., a first wafer and a second wafer, at a head end and a tail end of another wafer may be measured. FIG. 3 is a schematic view of an ingot according to an embodiment of the disclosure. With reference to FIG. 3, the wafers at the head and tail ends of an ingot 2 are taken as a first wafer 21 and a second wafer 22.

The measuring instrument 110 measures the FWHM of a plurality of designated positions on the first wafer 21 and the second wafer 22, respectively. Here, five designated positions are designated to perform a sampling (measurement) step. The five designated positions are a center position and four representation positions respectively located in four quadrants.

Figure 4:
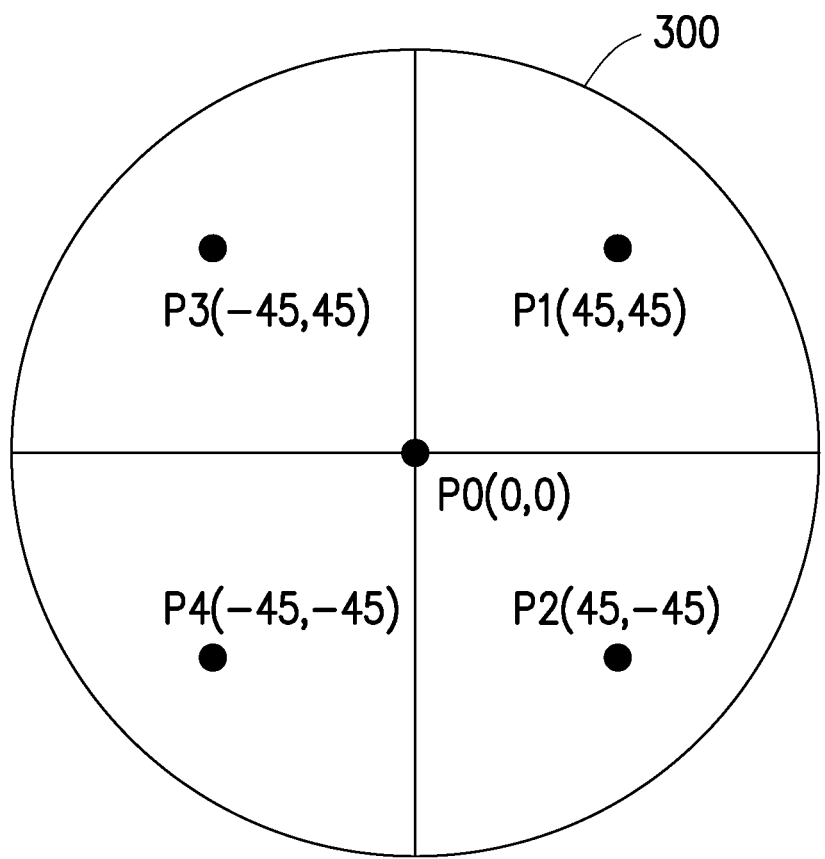
FIG. 4 is a schematic view of designated positions according to an embodiment of the disclosure.

FIG. 4 is a schematic view of designated positions according to an embodiment of the disclosure. As shown in FIG. 4, a wafer 300 includes designated positions P0 to P4. In this embodiment, the wafer 300 is, for instance, one of the first wafer 21 and the second wafer 22 at the head and tail ends of a wafer processed from the ingot 2. The center position (the designated position P0) on the wafer 300 is set as the origin (0, 0), the wafer is divided into four quadrants, and the representation positions P1 to P4 in the four quadrants are respectively selected. Here, for instance, a coordinate of the representation position P1 is (45, 45), a coordinate of the representation position P2 is (45, −45), a coordinate of the representation position P3 is (−45, 45), and a coordinate of the representation position P4 is (−45, −45). For instance, Table 1 shows the FWHM of the representation positions on the wafers (the first wafer 21 and the second wafer 22 at the head and tail ends) processed from the same ingot.

In step S210, each key factor corresponding to one of the ingots is calculated according to the FWHM of each wafer. Specifically, based on the respective FWHM of the first wafer and the second wafer processed from the same ingot, a first coefficient of variation of the first wafer and a second coefficient of variation of the second wafer are calculated. Based on the first coefficient of variation and the second coefficient of variation, the key factor is calculated.

An embodiment is provided below to explain detailed steps of calculating the key factor. Table 1 exemplifies the wafers at the head and tail ends, and the wafers are processed from a known ingot (e.g., the ingot 2 in FIG. 3); namely, the FWHM of the designated positions P0 to P4 on the first wafer 21 and the second wafer 22 are shown.

TABLE 1

| Coordinate of the representation position | FWHM of the first wafer 21 | FWHM of the second wafer 22 |
|---|---|---|
| P0(0, 0) | 97.8 | 124.1 |
| P1(45, 45) | 89.4 | 105.1 |
| P2(45, −45) | 92.4 | 107.8 |
| P3(−45, 45) | 90.6 | 105.1 |
| P4(−45, −45) | 101.9 | 114.4 |

First, an average value of the FWHM and a standard deviation of the first wafer 21 are calculated, and an average value of the FWHM and a standard deviation of the second wafer 22 are calculated. A first coefficient of variation of the first wafer 21 is calculated according to the average value of the FWHM and the standard deviation of the first wafer 21, and a second coefficient of variation of the second wafer 22 is calculated according to the average value of the FWHM and the standard deviation of the second wafer 22.

A method of calculating the standard deviation is provided below:

$$STD = \sqrt{\frac{1}{N-1}\sum_{i=1}^{N}(x_i - \bar{x})^2}$$

Here, N is the number of the FWHM, $x_i$ is the i-th FWHM, and $\bar{x}$ is the average value of the FWHM.

A method of calculating the coefficients of variation is provided below:

$$CV = \frac{STD}{\bar{x}}$$

After obtaining the first coefficient of variation of the first wafer 21 and the second coefficient of variation of the second wafer 22, a difference between the first coefficient of variation and the second coefficient of variation is calculated, and an absolute value of the difference is obtained as the key factor corresponding to the ingot 2, i.e., the key factor of the wafer processed from the ingot 2. Table 2 shows the key factor corresponding to the ingot number 001 (the ingot 2 shown in FIG. 3) obtained according to the data in Table 1.

TABLE 2

| Ingot number 001 | First wafer | Second wafer |
|---|---|---|
| Average value | 94.42 | 111.3 |
| Standard deviation | 5.273708 | 8.10216 |
| Coefficient of variation | 0.055854 | 0.072796 |
| Key factor | 0.016942 | |

Based on the method provided above, key factors corresponding to a plurality of ingots and an average of bows of a plurality of wafers processed from each ingot are calculated, as shown in Table 3.

TABLE 3

| Ingot number | Key factor | Average of bows |
|---|---|---|
| 001 | 0.016942 | 15.96 |
| 002 | 0.025422 | 60.48 |
| 003 | 0.037921 | 70.13 |
| 004 | 0.029729 | 98.84 |
| ... | ... | ... |

Figure 5:
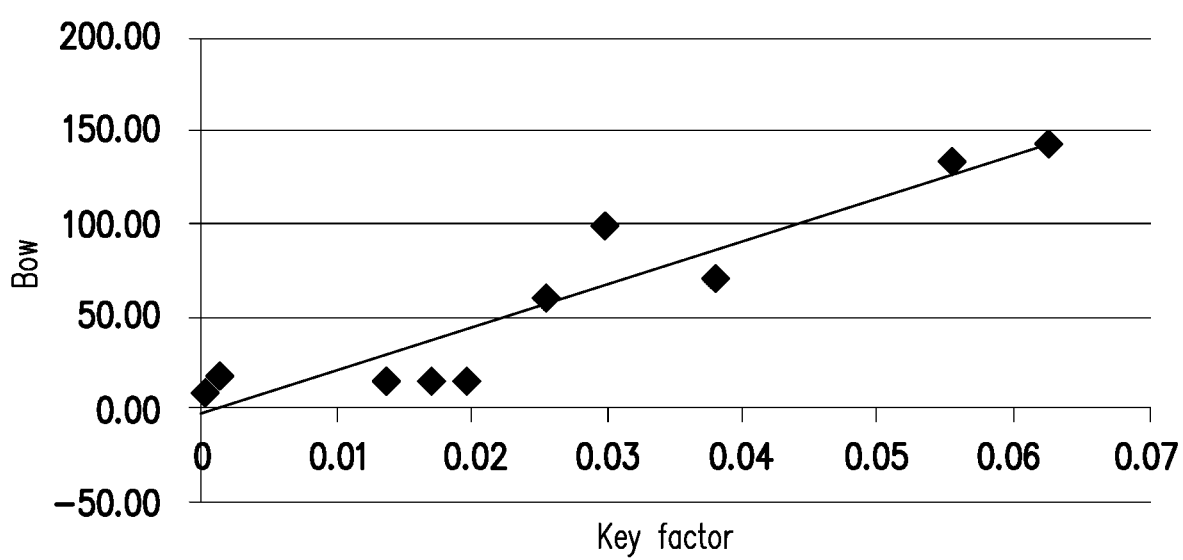
FIG. 5 is a curve diagram of a regression equation according to an embodiment of the disclosure.

After that, in step S215, a regression equation is obtained according to a plurality of key factors and the average of the bows. FIG. 5 is a curve diagram of a regression equation according to an embodiment of the disclosure. With reference to FIG. 5, in this embodiment, the regression equation is, for instance, $y=\alpha+\beta x$. The key factors and the average of the bows obtained from Table 3 are respectively taken as a y value and an x value, whereby $\alpha$ and $\beta$ are found. After calculation, the following is obtained: $\alpha=2.3671$, $\beta=2322.6$, and a correlation coefficient R is obtained as well, where $R^2=0.869$, and the regression equation is $y=-2.3671+2322.6x$. Specifically, the regression equation provided in one or more embodiments of the disclosure merely serves as an example and should not be construed as a limitation in the disclosure.

After the regression equation is obtained, when a to-be-measured ingot is obtained, it is likely to calculate a corresponding key factor by measuring a FWHM of a to-be-measured wafer corresponding to the to-be-measured ingot, and the key factor is input to the regression equation to obtain a predicted bow of a wafer processed from the to-be-measured ingot.

To sum up, according to one or more embodiments of the disclosure, the measurement data of a known wafer may be applied to perform training, whereby the regression equation may be obtained and may serve as a forecast model. Moreover, it is likely to use the wafers at the head and tail ends of the to-be-measured ingot to obtain the predicted bow of the wafer processed from the to-be-measured ingot. Accordingly, before the ingot is processed, the predicted bow of the corresponding wafer is obtained by applying the regression equation, so as to predict the geometric quality of the to-be-processed ingot, thereby reducing unnecessary waste.

It will be apparent to those skilled in the art that various modifications and variations can be made to the disclosed embodiments without departing from the scope or spirit of the disclosure. In view of the foregoing, it is intended that the disclosure covers modifications and variations provided they fall within the scope of the following claims and their equivalents.

What is claimed is:

1. A material analysis method, comprising:
   measuring, by a measuring instrument, a plurality of wafers processed from a plurality of ingots to obtain an average of bows of the processed wafers and a plurality of full widths at half maximum of the wafers;
   calculating each key factor corresponding to one of the ingots according to each of the full widths at half maximum of one of the wafers; and
   obtaining a regression equation based on the average of the bows and the key factors corresponding to the ingots.

2. The material analysis method according to claim 1, wherein the step of measuring, by the measuring instrument, the wafers processed from the ingots comprises:
   measuring the bows of the wafers processed from a same ingot of each of the ingots, respectively, and calculating the average of the bows based on the bows; and
   measuring the full width at half maximum of each of a plurality of designated positions on a first wafer and a second wafer of the wafers processed from the same ingot of each of the ingots.

3. The material analysis method according to claim 2, wherein the first wafer and the second wafer are wafers respectively located at a head end and a tail end of the same ingot.

4. The material analysis method according to claim 2, wherein the step of calculating each of the key factors corresponding to one of the ingots according to each of the full widths at half maximum of one of the wafers comprises:
   calculating a first coefficient of variation of the first wafer and a second coefficient of variation of the second wafer based on the full width at half maximum of each of the first wafer and the second wafer processed from the same ingot of each of the ingots; and
   calculating the key factor corresponding to the same ingot based on the first coefficient of variation and the second coefficient of variation.

5. The material analysis method according to claim 4, wherein the step of calculating the key factor based on the first coefficient of variation and the second coefficient of variation comprises:
   calculating a difference between the first coefficient of variation and the second coefficient of variation and obtaining an absolute value of the difference as the key factor.

6. The material analysis method according to claim 2, wherein the designated positions comprise a center position on each of the first wafer and the second wafer and four representation positions on each of four quadrants.

7. The material analysis method according to claim 6, wherein the center position on each of the first wafer and the second wafer is set as an origin, and each of the first wafer and the second wafer is divided into four quadrants.

8. The material analysis method according to claim 1, after obtaining the regression equation, the method further comprising:
   measuring a full width at half maximum of a to-be-measured wafer corresponding to a to-be-measured ingot, and calculating the key factor accordingly; and inputting the key factor to the regression equation to obtain a predicted bow of a wafer processed from the to-be-measured ingot.

* * * * *